United States Patent [19]

Scavino

[11] Patent Number: 4,610,387
[45] Date of Patent: Sep. 9, 1986

[54] DEVICE FOR BONDING WIRE LEADS IN ELECTRONIC COMPONENTS
[75] Inventor: Mario Scavino, Lesmo, Italy
[73] Assignee: Robotica S.r.l., Milan, Italy
[21] Appl. No.: 679,824
[22] Filed: Dec. 10, 1984
[30] Foreign Application Priority Data
Dec. 19, 1983 [IT] Italy .................. 23884/83[U]
[51] Int. Cl.⁴ .................................. B23K 1/06
[52] U.S. Cl. ......................... 228/1.1; 228/110
[58] Field of Search ........... 228/4.5, 1.1, 4.1, 7, 228/102, 110

[56] References Cited
U.S. PATENT DOCUMENTS
3,384,283  5/1968  Mims .................... 228/110
3,806,019  4/1974  Diepeveen ............. 228/4.5

FOREIGN PATENT DOCUMENTS
124240  9/1980  Japan .................... 228/4.5

Primary Examiner—Nicholas P. Godici
Assistant Examiner—Samuel M. Heinrich

[57] ABSTRACT

There is disclosed an improved device for bonding wires in electronic components, of the type comprising a member for moving the capillary to a location close to the bonding area or region and an ultrasonic transducer including an arm carrying on one end the capillary, the transducer being pivoted to the approach member and having associated therewith a linear motor controlled by a position transducer.

7 Claims, 4 Drawing Figures

DEVICE FOR BONDING WIRE LEADS IN ELECTRONIC COMPONENTS

The invention relates to an improved device for bonding wires in electronic components.

BACKGROUND OF THE INVENTION

Currently available devices for bonding electronic component wires may be basically reduced to two types: a first type, which is called "translatory" type hereiin and is shown diagramatically in FIG. 1, and a second type, called "rotary" type herein and is shown diagramatically in FIG. 2. Both devices perform the same operations under the drive of a single motor, but having different layouts in principle and exhibit different advantages and disadvantages.

For a given installed drive power, the translatory type device of FIG. 1 is slower than the rotary type device of FIG. 2, since larger reciprocating masses are involved therein, but, at the same time, it affords a higher degree of accuracy in bonding than the rotary type device. This is especially true where the bonding points are located at different elevations. In fact, with the rotary device, its capillary movement follows, in use, an arc of a circle which—in view of the minute extent of the movements involved—may be likened to a straight segment of a line. Where the bonding spots are located at different elevations, by contrast, the circular character of the path of movement becomes increasingly more significant as the difference between such elevations increases, and the capillary is positioned offset with respect to the perpendicular to the locus, thus effecting an incorrect soldered joint. The present invention reconciles speed and accuracy of operation. In accordance with the invention a motor is effective to bring, where required, the capillary rapidly as close as feasible to the bonding spot, the capillary being driven through the final portion of its stroke by a cam which can impart the capillary with the motion directly ahead of and during the bonding step. The latter device, having two degrees of freedom, while driving the capillary gently and accurately at a high rate, cannot change the motion in situations that may require it, unless the cam is replaced with another cam having a more appropriate profile to the occasion; this is specially true of instances where successive soldered joints are to be made at different elevations.

It is an object of this invention to provide an improved device for bonding wires leads in electronic components, which can operate at as fast a rate as a device of the rotary type, as accurately as a device of the translatory type, and afford a degree of flexibility in operation such as not even modern cam devices can afford.

This and other objects of the invention will become apparent to be skilled ones from the description which follows and appended claims.

An improved device for bonding electronic components wires, according to the invention, is of a type which comprises a member for fast approaching the capillary to the solder spot, and an ultrasonic transducer including an arm carrying said capillary on one end, said transducer being mounted pivotally on said fast approach member, and is essentially characterized in that associated with said transducer is a linear motor having its field magnet rigidly attached to said fast approach member and its field coil associated with said transducer.

BRIEF DESCRIPTION OF THE DRAWINGS

The improved device of this invention is illustrated, by way of example and not of limitation, in the accompanying drawings, where.

Throughout the drawing views, including those showing prior devices, like parts are designated with the same reference numerals.

DETAILED DESCRIPTION

Figure 1:
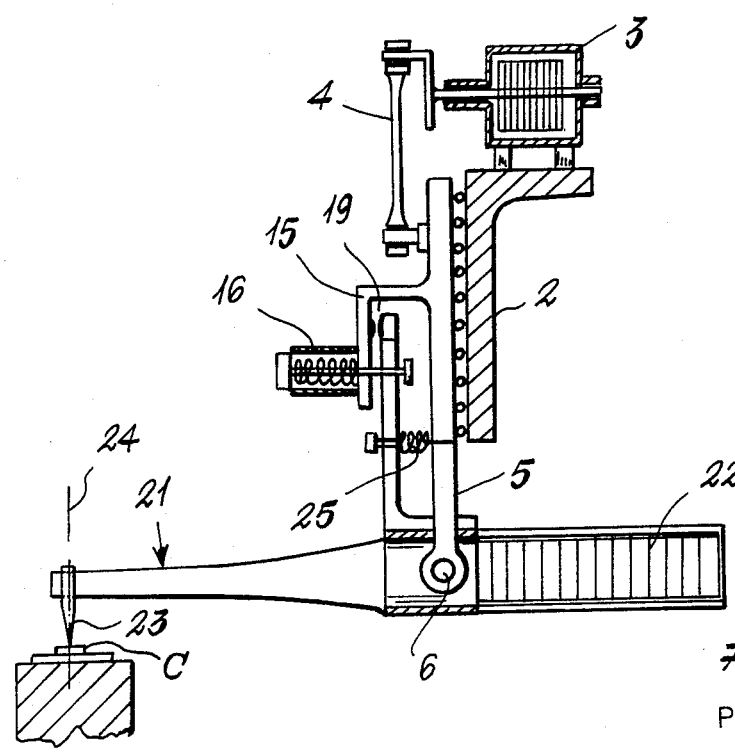
FIG. 1, as already referred to in the preamble, shows a conventional device of the translatory type.
Figure 2:
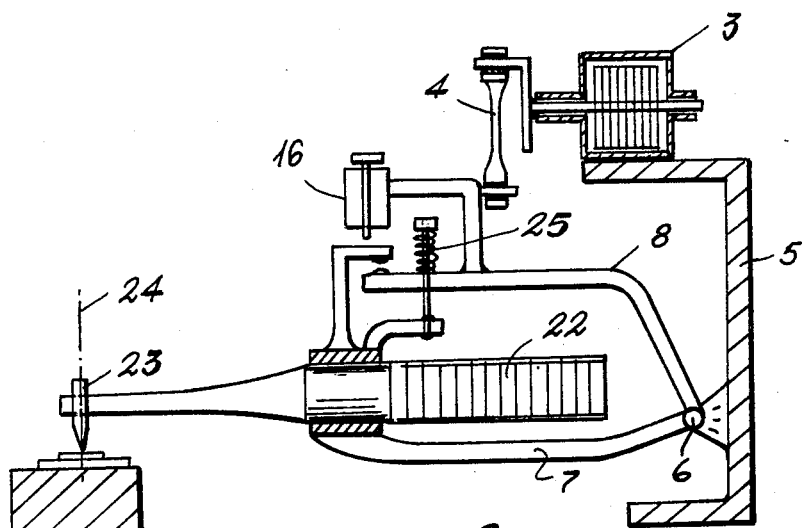
FIG. 2, also as referred to in the preamble, shows a conventional device of the rotary type.
Figure 3:
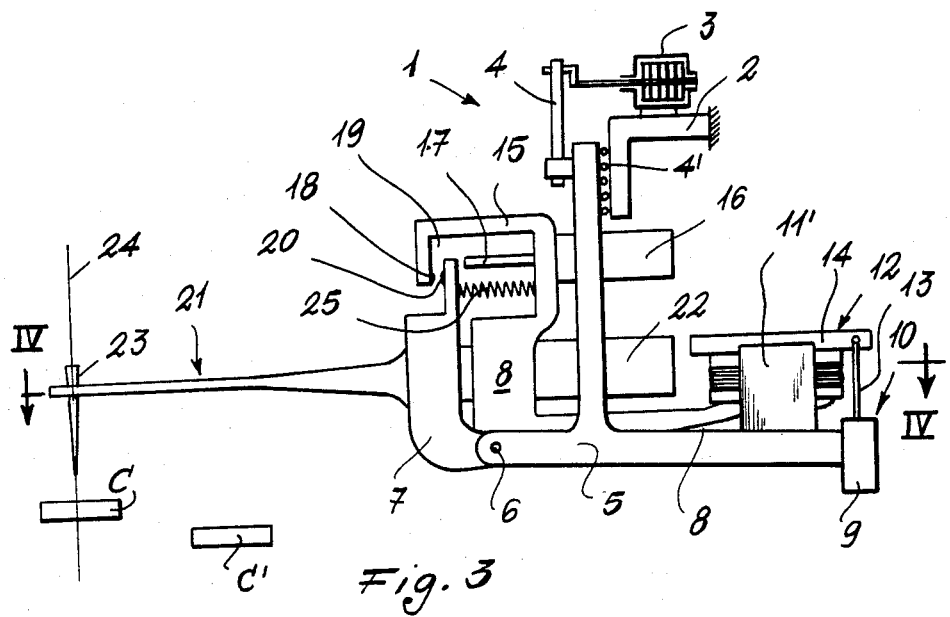
FIG. 3 is a diagramatic side view of the inventive device.
Figure 4:
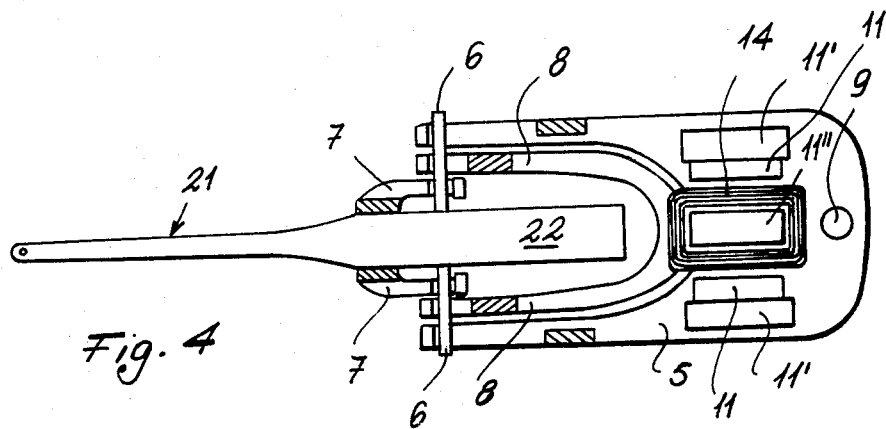
FIG. 4 is a sectional view taken along the line IV—IV of FIG. 3.

With particular reference to FIGS. 3 and 4, this device, as generally indicated at 1, comprises a bearing structure 2 whereto a motor 3 is mounted which drives a connecting rod/crank linkage 4 acting on a first frame 5 through roller guides 4'. Said first frame 5 has a pivot point 6 whereat a second frame 7 and third frame 8 are pivotally connected. Rigid with the frame 5 is a static winding 9 of a position transducer, generally indicated at 10, of the Linear Variable Differential Transformer (LVDT) type, as well as a pair of magnets 11 of a linear motor, generally indicated at 12. The moving element 13 of the position transducer 10 and a coil 14 of the linear motor 12 are made associated with the frame 8 which has, at a remote location from the linear motor 12, an arm 15 supporting an electromagnet 16 and related plunger rod 17, and a first portion 18 of a contact 19.

More specifically, the coil 14 has a square or rectangular cross-sectional configuration with the turns lying on parallel planes perpendicularly to the plane of motion of the capillary 23. It follows that, the current and magnetic flux define a plane coincident with that of the capillary 23, thereby the resulting force will be at all times directed into said plane. The magnets 11 have parallelepipedal configurations and extend on parallel planes to said capillary plane of action, and are housed in an iron holder 11' having a middle portion 11" around which the coil 14 is located.

The second portion 20 of the contact 19 is carried on the frame 7 forming a support for an ultrasonic transducer 21 which carries, on a first end thereof, a coil 22, and on the second end thereof, a capillary 23 wherethrough a wire 24 forming the material to be bonded extends. Provided between the frames 7 and 8 is a spring 25 whose function will be explained hereinafter.

In operation, energization of the electromagnet 16 results in its plunger rod 17 moving forward to lock the frame 7 to the frame 8 and close the contacts 18 and 20. The operation of the motor 3, via the connecting rod and crank 4, drives the frame 5 downwards to bring the pivot point 6 level with the bonding spot C. That downward movement of the frame 5 results in a correponding displacement of the frames 7 and 8, owing to the latter being also pivoted at 6 and locked together package-like; such package-like locking is necessary in order to prevent incidental relative movements of the frames 7 and 8 as the capillary 23 is being approached to the bonding spot C and consequent sudden stop at the desired close distance. The electromagnet may be now de-energized to release the frames 7 and 8 which hold, however, the contacts 18 and 20 closed on account of the action of spring 25.

Energization of the linear motor 12 results in a rotation of the frame 8 and, via the spring 25, of the frame 7 as well, thereby causing the capillary 23 to move through the final close up distance. On the capillary 23 contacting the bonding spot C, the contacts 18 and 20 are opened and the spring 25, by resisting the opening of said contacts, provides the required bonding pressure for the capillary 23.

The opening of the contacts 18 and 20 may be used as a signal to energize the coil 22 and effect the bonding by ultrasonic effect. The travel distance of the linear motor 12, and accordingly the rotation of the transducer 21, is controlled by the position transducer 10 which is controlled, in turn, by an electronic unit, of suitable design and known per se, which is not shown and is not pertinent to this invention.

On completion of the bonding at the spot C, the device 1 is conventionally moved over to a second bonding spot C' shown in FIG. 3 at a lower elevation than the spot C. In order to accomodate the difference in elevation between the spots C and C', the motor 3 is again operated to bring the pivot point 6 to a position level with the spot C', and the above-listed sequence of operations are reiterated.

The linear motor 12 controls the movement of the capillary 23, which takes sequentially place as follows:
up to form the loop in the wire;
down to the second bonding region;
up, after completing the second bond, to determine the next wire length to form a ball known as the "tail";
up to pass the electrode under the tail;
down to the following region of first bond.

Through appropriate programming of the electronic unit, it would, of course, possible where necessary to combine the movements controlled by the motors 3 and 12 so as to increase the device rate of operation.

I claim:

1. A device for bonding wire leads in electronic components, of the type comprising a capillary, means for moving the capillary to a location close to a bonding spot and an ultrasonic transducer including an arm carrying on one end said capillary, said transducer being pivoted to said moving means, said moving means comprising a first frame, a second frame rigidly connected to said transducer and pivotally connected to said first frame at a pivot mount, and a third frame pivotally mounted to said first and second frames at said pivot mount, and means for selectively locking said second frame to said third frame and for restricting pivotal movement of said second frame relative to said third frame.

2. A device according to claim 1, wherein said moving means further comprises a linear motor for imparting pivotal motion to said third frame relative to said first frame, and further including a position transducer for controlling said linear motor and wherein said linear motor has at least one magnet rigid with one of said first and third frame members and a coil mounted to the other of said first and third frame members and associated with said position transducer.

3. A device according to claim 2 characterized in that said position transducer has a detector portion rigid with said magnet and a moving portion associated with said coil.

4. A device according to claim 1, characterized in that the coil of said linear motor has a square or rectangular cross-sectional configuration with the coil turns being laid in parallel planes perpendicularly to a plane of action of said capillary, said at least one magnet of said linear motor having a parallelepipedal configuration and being positioned on a metal holder having a middle portion around which said coil is mounted, said at least one magnet extending on parallel planes to the plane of action of said capillary.

5. A device for bonding wire leads in electronic components comprising in combination: a first frame member (5), a second frame member (7), and a third frame member (8), said second and third frame members (7, 8) being pivotally supported by said first frame member (5) on a common axis (6), locking means (16, 17) supported by the third frame member (8) for temporarily locking the third and the second frame members (7, 8) together, a capillary means (23), an ultrasonic transducer (21), said capillary means (23) being carried by said ultrasonic transducer (21) and said ultrasonic transducer (21) in turn being carried by said second frame member (7), spring means (25) disposed between said second and third frame member (7, 8), a linear motor (12) for pivoting said third frame member (8), a position transducer (10) between said first and third frame members (5, 8) for controlling said linear motor (12), said linear motor (12) comprising at least a pair of permanent magnets (11) carried by said first frame member (5) in mutual parallel relation, and a coil means (14) carried by said third frame member (8) and movable between said pair of permanent magnets (11) so to impart an angular motion to said third frame member (8) when said coil means is energized.

6. The apparatus according to claim 5, further comprising driving and guiding means (3, 4, 4') for displacing said first frame member (5) in vertical translation.

7. The apparatus according to claim 5, wherein said spring means urges said second and third frame members away from each other.

* * * * *